US007277841B1

United States Patent
Novak et al.

(10) Patent No.: US 7,277,841 B1
(45) Date of Patent: Oct. 2, 2007

(54) METHOD FOR ADAPTIVE SUB-GRIDDING FOR POWER/GROUND PLANE SIMULATIONS

(75) Inventors: Istvan Novak, Maynard, MA (US);
Jason R. Miller, Cambridge, MA (US);
Eric L. Blomberg, Woburn, MA (US);
Deborah Foltz, Pelham, NH (US);
Kenneth Laird, Pittsburgh, PA (US)

(73) Assignee: Sun Microsystems, Inc., Santa Clara, CA (US)

( * ) Notice: Subject to any disclaimer, the term of this patent is extended or adjusted under 35 U.S.C. 154(b) by 768 days.

(21) Appl. No.: 10/361,043

(22) Filed: Feb. 7, 2003

Related U.S. Application Data

(60) Provisional application No. 60/356,043, filed on Feb. 11, 2002.

(51) Int. Cl.
*G06F 17/50* (2006.01)
(52) U.S. Cl. .............................. 703/18; 716/8; 716/13
(58) Field of Classification Search .................. 703/18; 716/13–15
See application file for complete search history.

(56) References Cited

U.S. PATENT DOCUMENTS 5,745,371 A 4/1998 Shouen

| | | | |
|---|---|---|---|
| 6,557,154 B1 * | 4/2003 | Harada et al. | 716/11 |
| 6,571,184 B2 * | 5/2003 | Anderson et al. | 702/65 |
| 6,618,834 B2 | 9/2003 | Takeyama et al. | |
| 6,631,502 B2 * | 10/2003 | Buffet et al. | 716/4 |
| 6,850,878 B2 * | 2/2005 | Smith et al. | 703/18 |

* cited by examiner

*Primary Examiner*—Paul Rodriguez
*Assistant Examiner*—Andre Pierre-Louis
(74) *Attorney, Agent, or Firm*—Meyertons Hood Kivlin Kowert & Goetzel, P.C.; Erik A. Heter

(57) ABSTRACT

An adaptive subgridding method for power/ground plane simulations. The method includes superimposing a grid of cells onto a circuit plane. For each cell, the method may determine a fill ratio representing the amount of area in a given cell that overlaps with the circuit plane. For each cell having a fill ratio that is less than a predetermined upper limit or a predetermined lower limit the cell may be divided into a plurality of subcells. The method may then determine the fill ratio for each of the subcells. As with the original cells, each of the subcells having a fill ratio less than the predetermined upper limit and greater than the predetermined lower limit may be further subdivided into additional subcells. The loop may repeat itself until a predetermined integer value is reached, wherein the integer value indicates the number of times a cell may be subdivided.

32 Claims, 6 Drawing Sheets

METHOD FOR ADAPTIVE SUB-GRIDDING FOR POWER/GROUND PLANE SIMULATIONS

PRIORITY INFORMATION

This application claims priority to provisional Patent Application No. 60/356,043 filed on Feb. 11, 2002.

BACKGROUND OF THE INVENTION

1. Field of the Invention

This invention relates to simulation of electronic systems, and more particularly, to the simulation of power and ground planes.

2. Description of the Related Art

Designing a power distribution system often times includes the performing of simulations of both the power distribution system itself and the circuit(s) to which it will supply power. Such simulations may be conducted using various software tools and models (e.g., SPICE models) of the power distribution system. The simulations may be used to verify the operational characteristics of the power distribution system, and may also provide information useful in altering a design to meet specifications.

Creating a model of a power distribution system includes the modeling of power and reference (e.g., ground) planes. One commonly used method of modeling power and ground planes includes creating grids of square or rectangular cells, where each cell may be modeled as transmission line segments. FIG. 1A is a drawing of an exemplary grid of cells. In this particular example, each cell includes four nodes which are connected to other nodes by transmission line segments in order to form cells.

For power/ground planes that are square in shape and continuous (e.g., no apertures in the plane), this method may work well by allowing the grid to easily approximate the size and shape of the plane being modeled. However, this method may have drawbacks for planes with apertures or irregular shapes.

FIG. 1B is a drawing of a uniform shaped grid superimposed on an irregularly shaped plane. In this particular example, grid 7 is superimposed on plane 5. While grid 7 has a uniform rectangular shape, plane 5 has an irregular shape which includes apertures in the plane. Grid 7 is a 28×20 grid, and thus includes 560 cells. Thus, in this instance there are 91 cells that are completely outside of the plane shape.

In software tools such as SPICE, an increase in the number of nodes in a grid (which corresponds directly to the number of cells in the grid) may cause a sharp increase in the amount of time required to perform the various simulations. Furthermore, the extra time used to perform the simulation may yield no additional useful output.

Another hazard of using this method is that the accuracy of the simulation may be compromised. In particular, using a uniform shaped grid to approximate an irregular shaped plane may cause resonances to be characterized incorrectly. Some resonances may be dependent upon standing wave patterns which are determined by the actual shape of the plane, including any apertures. As such, both the location and frequency of these resonances may not be accurate with respect to the actual plane being simulated. Accurate characterization of resonances may be especially important in the design of power distribution systems for determining locations where decoupling capacitors are to be placed, as well as determining the electrical characteristics of the capacitors to be used. Thus, if resonances are improperly characterized, it may not be possible to meet target impedance requirements for the power distribution system.

SUMMARY OF THE INVENTION

An adaptive subgridding method for power/ground plane simulations is disclosed. In one embodiment, the method includes superimposing a grid of cells onto a representation of a circuit plane. The method may determine a fill ratio representing the amount of area in a given cell that overlaps with the circuit plane for each of the cells in the grid. For each cell having a fill ratio that is less than a predetermined upper limit (e.g., 100%) or a predetermined lower limit (e.g., 0%), the cell may be divided into a plurality of subcells. The method may then determine the fill ratio for each of the subcells produced from dividing the original cell. As with the original cells, each of the subcells having a fill ratio less than the predetermined upper limit and greater than the predetermined lower limit may be further subdivided into additional subcells. This loop may repeat itself until a predetermined integer value is reached, wherein the integer value indicates the number of times a cell may be subdivided (or a number of times the loop may be repeated).

In one embodiment, the method may be used to create a model of an electronic circuit suitable for use with various types of design tools (e.g., SPICE). Circuit planes utilized for power and/or ground planes may be modeled using the method, and may be combined with other components of the electronic circuit being modeled. The model may be used for simulating operation of the entire electronic circuit, simulating operation of the power distribution system of the circuit, or in determining the required decoupling capacitors for the power distribution system, among other uses. In creating a model, cells which are empty may be assigned a value of zero, or ignored by the simulation software. Thus, fewer calculations may be required in order to simulate the circuit.

In another embodiment, the method may be applied to a pair of circuit planes (e.g. a power plane and a ground plane) separated by a dielectric layer. In determining the fill ratio for a cell when using the method with a pair of planes, the method may determine the amount of overlap between the circuit planes within each cell of the grid.

BRIEF DESCRIPTION OF THE DRAWINGS

Other aspects of the invention will become apparent upon reading the following detailed description and upon reference to the accompanying drawings in which.

Figure 1A:
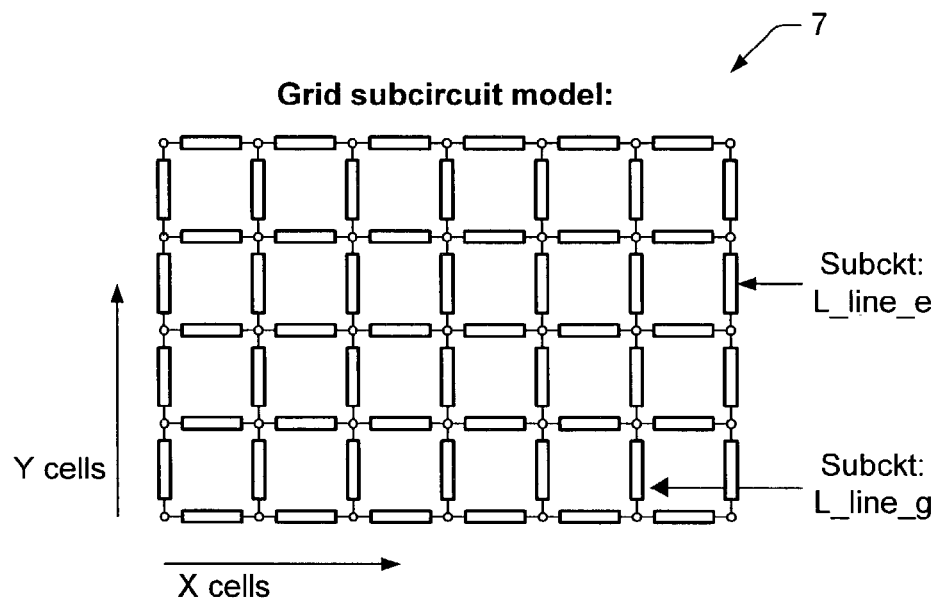
FIG. 1A (Prior Art) is a drawing of a grid of cells used to model one embodiment plane (e.g., a power plane)
Figure 1B:
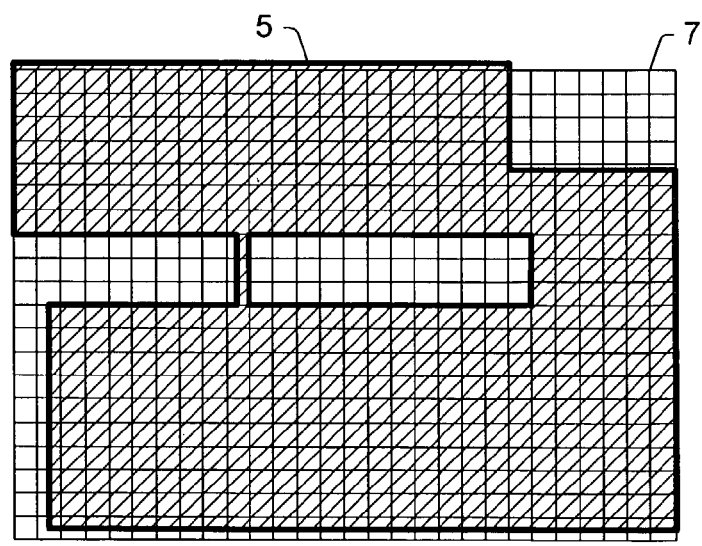
FIG. 1B (Prior Art) is a drawing of one embodiment of a uniform grid superimposed on plane having an irregular shape.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2A:
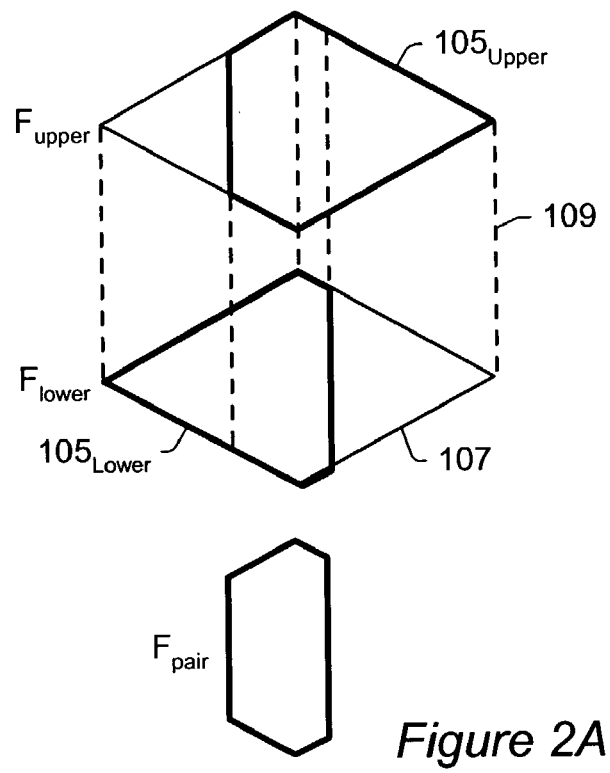
FIG. 2A is a diagram illustrating the calculation of fill ratios for one embodiment where the method is applied to a pair of circuit planes separated by a dielectric layer.

FIG. 2A is a diagram illustrating the calculation of fill ratios for a cell in one embodiment where the method is applied to a pair of circuit planes separated by a dielectric layer. The dielectric layer may be made of virtually any dielectric material. In the embodiment shown, a pair of circuit planes $105_{upper}$ and $105_{lower}$ are separated by dielectric layer 109. A portion $F_{upper}$ of circuit plane $105_{upper}$ overlaps with the cell shown in FIG. 3, as does a portion $F_{lower}$ of circuit plane $105_{lower}$. The portion of the cell where circuit planes $105_{upper}$ and $105_{lower}$ overlap is shown as $F_{pair}$. When determining the overall fill ratio for the cell, the method may determine the amount of overlap between each circuit plane of the pair in calculating the fill ratio of the cell, $F_{pair}$.

While the method may determine the overlap of the circuit planes within the cell for determining its composite fill ratio, the fill ratios of the individual conductive layers may be used for AC and DC resistances. The composite fill ratio may be used to calculate the static capacitance, equivalent inductance of the cell, or other electrical characteristics such as a characteristic impedance ($Z_o$), propagation delay ($t_{pd}$), resistances $R_{upper}$, $R_{lower}$, and $R_p$.

The electrical parameters may be adjusted based on the composite fill ratio of the cell, $F_{pair}$, or the fill ratios of the individual planes. The impedance $Z_o$, which is the characteristic impedance of a transmission line representing a unit cell may be adjusted based on the composite fill ratio using the formula $Z_{o\_new} = Z_o/F_{pair}$. The unit resistances of the upper and lower planes for each cell may be adjusted using the formulas $R_{upper\_new} = R_{upper}/F_{upper}$ and $R_{lower\_new} = R_{lower}/F_{lower}$. The parallel resistance loss of the unit cell (for a pair of planes) $R_p$ may be adjusted using the formula $R_{p\_new} = R_p/F_{pair}$. The adjustment of the electrical parameters based on fill ratios may allow for more accurate electrical modeling of the planes.

FIGS. 2B through 2H will now be used to illustrate one embodiment of the adaptive subgridding methodology for power/ground plane simulations. The example illustrates a portion of a circuit plane, wherein a grid of cells is superimposed upon the circuit plane. In the embodiment shown, each of the cells in the grid may be square in shape, although embodiments wherein the cells are rectangular in shape are possible and contemplated. The sides of the cells may represent transmission line segments that may be connected by nodes. Performing the methodology may result in a circuit model of the circuit plane (or plane pair) upon which it is performed which may more accurately represent the shape of the plane(s) upon which the model is based. This may allow simulations by design tools to more accurately characterize the operation of the circuit in which they are utilized (e.g., capture resonances more accurately, etc.).

Figure 2B:
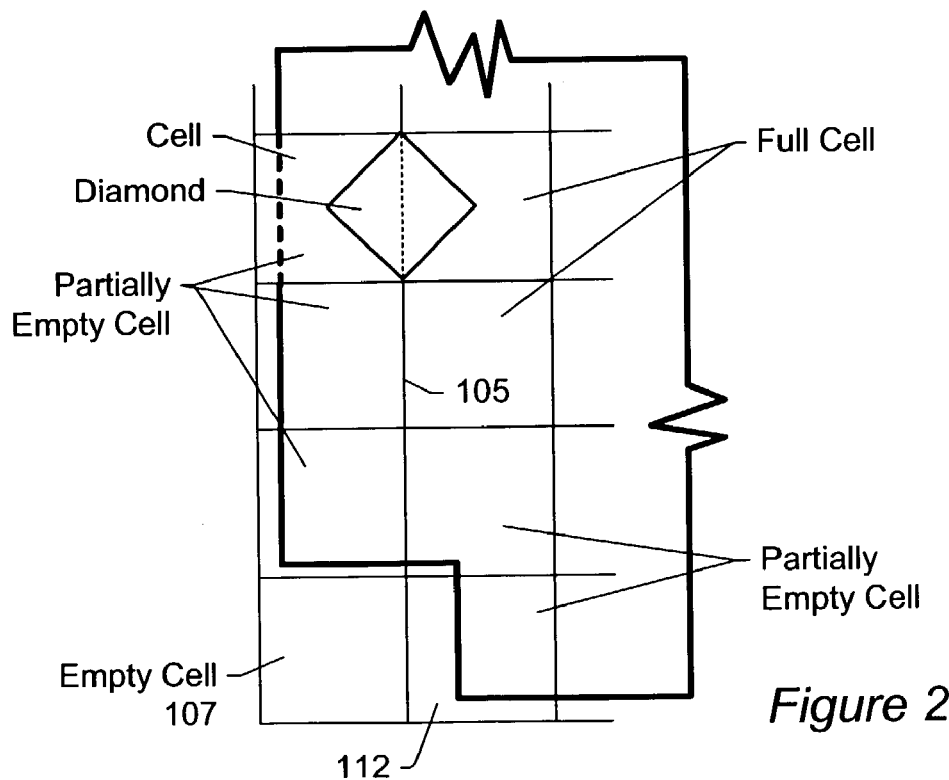
FIG. 2B is a drawing of a grid of cells superimposed on one embodiment of a circuit plane.

Turning now to FIG. 2B, a drawing of a grid of cells superimposed on one embodiment of a circuit plane representation is shown. In the embodiment shown, a portion of grid 107 is shown superimposed over a portion of circuit plane 105. It should be noted that the method may also be applied to pairs of circuit planes which are separated by a dielectric layer, and thus circuit plane 105 shown here may only be one of such a pair.

Grid 107 includes a plurality of cells which may be designated as empty, partially empty, or full. In general, the method may determine the fill ratio of each cell relative to both a predetermined upper limit and a predetermined lower limit. In the embodiment shown, the predetermined upper limit is 100% while the predetermined lower limit is 0%, although embodiments having other predetermined limits fill ratios are possible and contemplated. The method may determine a cell to be full if its fill ratio meets or exceeds the predetermined upper limit. Similarly, if a cell is at or below the predetermined lower limit, the method may determine the cell to be empty. Any cell in which the fill ratio is between the predetermined upper and lower limits may be considered to be partially empty by one embodiment of the method. The fill ratio of any given cell may be defined as the portion of that cell which overlaps with circuit plane 105.

As noted above, the sides of each cell may represent a transmission line segment. The transmission line segment may represent a diamond-shaped portion of the circuit plane. An example of a diamond-shaped area represented by a transmission line segment is shown in FIG. 2B. For the coarsest grid size (i.e. largest cell size before any cell division occurs), all portions of circuit plane 105 may be covered by a diamond shaped portion, or a partial diamond shaped portion (e.g. half-diamond) at the boundaries of the plane. When the methodology is applied to a pair of circuit planes, other shapes may cover portions of the circuit planes, as will be illustrated below.

The method may begin by scanning of grid 107 in order to determine the fill ratio for each cell. For cells that are empty, the method may designate these cells to be eliminated from the grid or otherwise ignored in any subsequent simulation of the circuit based on circuit plane 105. Full cells may need no division and can be modeled based on the coarsest grid size. For partially empty cells, such as cell 112 shown in the drawing, division of the cell into subcells may be necessary in order to more accurately model the shape of circuit plane 105.

Figure 2C:
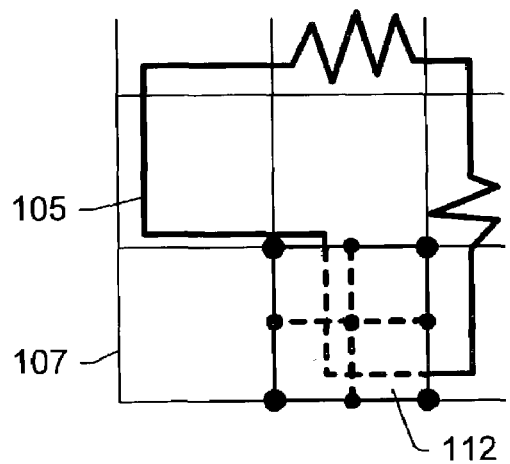
FIG. 2C is a drawing of a grid of cells superimposed on one embodiment of a circuit plane, wherein a partially empty cell in the grid has been subdivided into a plurality of subcells.

In FIG. 2C, cell 112 has been divided into 4 subcells. In one embodiment of the method, cell divisions occur in powers of 2 (e.g. $2^2$ subcells resulting from the division in this case). Embodiments are possible and contemplated wherein the cells are divided into 2 subcells, 8 subcells, and so on. The subcells produced by dividing cell 112 are similar to the original cells of grid 107 in that each side of a subcell represents a transmission line segment. Each of the transmission line segments is connected to other transmission line segments by nodes. In this example, 5 new nodes are produced by the division of cell 112 into four subcells.

In other embodiments, a cell may be divided into a number of subcells that is not a power of 2. For example, a rectangular shaped cell may be subdivided into 3 equally sized subcells, where the subcells may be square or rectangular in shape. In such an embodiment, this division may be accomplished by essentially dividing the cell into 3 subcells along the axis of the width of the rectangle. Similarly, in another embodiment, a rectangular cell may be subdivided into 6 subcells by dividing the rectangular cell in half along the axis of its length and into thirds along the axis of its width. In general, square or rectangular cells and subcells may be divided into any number of subcells. The subcells may be of square or rectangular shape, and it is not necessary that the number of divisions on each side of the cell be equal.

Each of the four subcells produced from the division of cell 112 may be scanned in the same manner as the original cells of grid 107. As shown here, the upper right subcell resulting from the division is a full subcell, while the other subcells resulting from the division are partially empty. For the upper right subcell, no further subdivision is necessary for modeling of circuit plane 105. However, subdivision of the remaining subcells may be required in order to more accurately model the electrical characteristics resulting from the contours of the circuit plane.

Figure 2D:
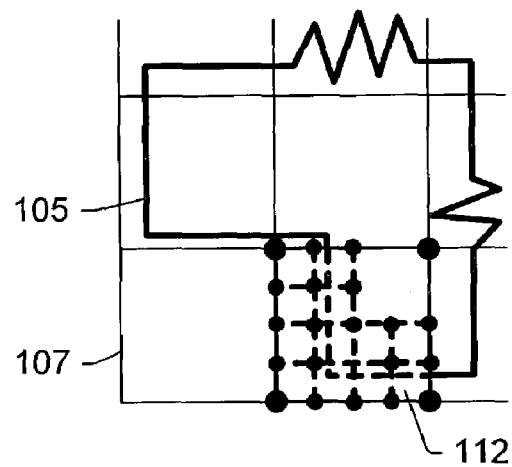
FIG. 2D is a drawing of a grid of cells/subcells superimposed on one embodiment of a circuit plane, wherein partially empty subcells in the grid have been further subdivided.

FIG. 2D illustrates the result of further subdivision of the partially empty subcells which resulted from the division of cell 112 discussed in reference to FIG. 2B. Similar to the original division of cell 112 shown in FIG. 2B, each of the partially empty subcells has been subdivided into 4 new subcells and has thereby created 5 additional circuit nodes.

The subcells resulting from the subdivision may be scanned as cells and subcells were in the previous method steps. As a result of the subdivision of the subcells, four new empty cells have been created as shown in the drawing. These empty subcells need not be considered for further modeling, and may be dropped from the grid, assigned a zero value, or designated as subcells to be ignored by circuit simulation software which may utilize the circuit model resulting from the methodology. Two of the newly produced subcells shown in FIG. 2D are full, and may thus require no further changes to model the area of circuit plane 105 which they cover. The remainder of the cells produced from the subdivision are partially full in this example.

Figure 2E:
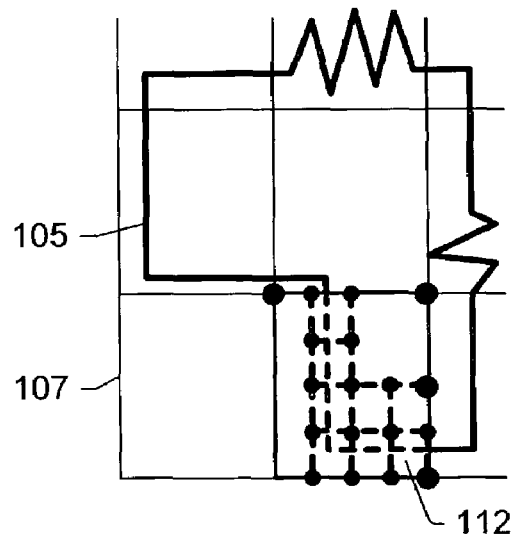
FIG. 2E is a drawing of a grid of cells superimposed on one embodiment of a circuit plane following a final subdivision of subcells.

One important user input in the methodology is an integer value that indicates the number of iterations of divisions/subdivisions that may occur. In the example shown herein, the integer value is set at 2. Since 2 iterations of division/subdivision have occurred in this example, no further subdivisions may occur. Thus, the selected integer value may provide an unconditional stopping point for subdivision iterations. Additional subdivisions may occur in other instances when a user of the methodology selects a greater integer value. Other embodiments are also possible and contemplated wherein subdivisions may continue indefinitely until a certain condition is reached. For this example, FIG. 2E illustrates the final result of the subdivision process.

Following the completion of the subdivision process, the method may scan the resulting subcells to determine their fill ratio. In one embodiment, any subcell having a fill ratio of greater than 50% may be modeled as if it were a full subcell. Subcells that have less then a 50% fill ratio may be modeled as open-ended transmission line segments, or may replace the open-ended transmission line segments with a capacitance value. Embodiments using a fill ratio other than 50% for this particular step are possible and contemplated.

Figure 2F:
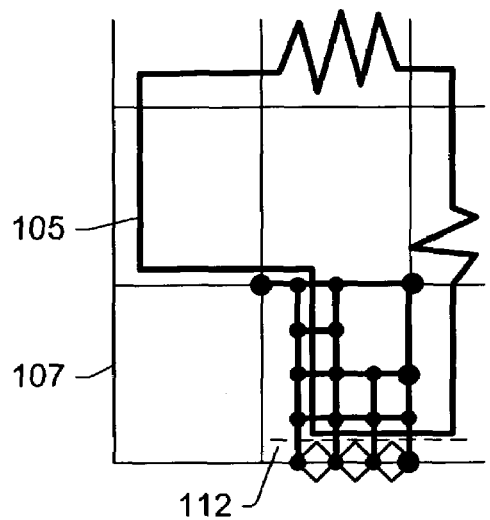
FIG. 2F is a drawing of a grid of cells superimposed on one embodiment of a circuit plane illustrating open-ended segments following the final subdivision.

In FIG. 2F, the bottom row of subcells cells (shown with their diamond coverage area) have a fill ratio of less than 50%, while three of the subcells in the leftmost column have a greater than 50% fill ratio. For the bottom row of cells, open-ended transmission line segments result. Although some circuit simulation software may be able to handle open-ended transmission line segments, the open-ended segments may be replaced by a segment having a capacitance value. Various methods may be used to determine the capacitance value. In one embodiment (in which the methodology is applied to a pair of circuit planes), calculating the static capacitance may include calculating a result for the formula:

$$C_C = \varepsilon_0 \varepsilon_r \frac{(\text{grid\_size})^2}{\text{plane\_separation}},$$

wherein the grid_size is the size of the subcell resulting from the subdivision process, plane_separation is the distance between the circuit planes, and $\epsilon_r$ is the relative dielectric constant of the dielectric material separating the circuit planes. It should be noted that the exact formula used to determine such a capacitance value may vary with the circuit plane being modeled, and thus other embodiments using a different formula to determine the compensating capacitance are possible and contemplated.

In some embodiments, the actual fill ratio may be determined instead of the simple determination of whether the fill ratio of the subcell is greater or lesser than 50%. In such embodiments, the grid_size term may be determined by multiplying the size of the subcell by the actual fill ratio. For example, if the actual fill ratio of a given subcell is 60%, then the value used in the formula above for the grid_size term will be 60% of the full size (i.e. 100%) subcell. This may allow for more accurate modeling of the grid.

Figure 2G:
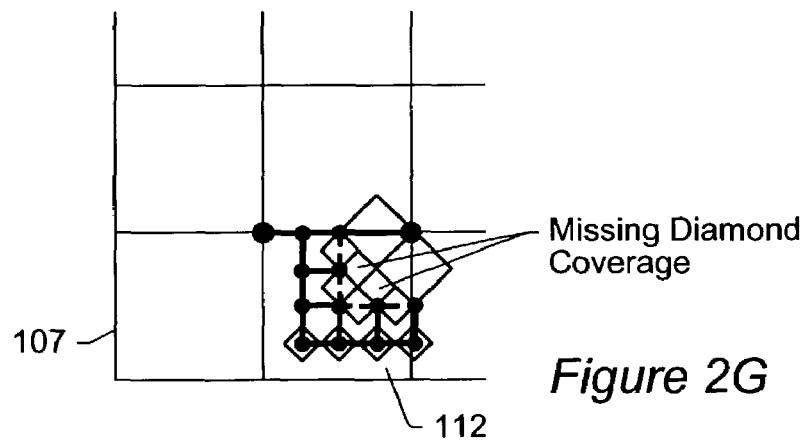
FIG. 2G is a drawing of a grid of cells superimposed on one embodiment of a circuit plane illustrating missing diamond coverage, prior to compensation, that may result from the adaptive subgridding algorithm.

In addition to using the above formula for dealing with open ended segments that may result from the subdivision process, the formula may also be used to calculate static capacitance values for areas of missing diamond coverage. FIG. 2G illustrates missing diamond coverage for one embodiment of the method. As shown in FIG. 2G, the embodiment of the method discussed herein may created nodes at the boundaries of segments of different subdivision values. In such cases, portions of the plane may not be covered by the appropriate diamonds. In this particular example, the subdivision process has created two areas of missing diamond coverage. This may be a common occurrence when a larger cell/subcell borders smaller subcells. When this occurs, the missing areas of coverage may be identified and replaced with a static capacitance. The static capacitance may be determined using the formula above, with the value of the area(s) of the missing diamond coverage substituted for the grid_size term.

Figure 2H:
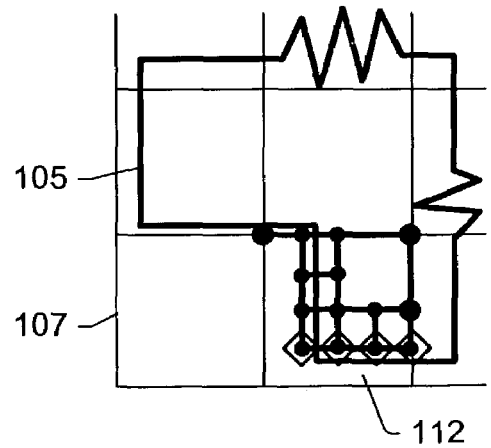
FIG. 2H is a drawing of a grid of cells superimposed on one embodiment of a circuit plane illustrating the grid representation following the replacement of the open ended segments by a compensation routine

FIG. 2H illustrates the final form of the area of interest following the replacement of the open-ended segments with compensating capacitances. The diamonds centered around the bottom row of nodes are representative of the compensating capacitances which replaced the open-ended transmission line segments. In some embodiments, replacement of the open-ended transmission line segments may speed up circuit simulations while preserving the total capacitance of the structure which the model is to represent.

In some embodiments, a user may specify a certain area for subdivision to occur (area subdivision) or may specify a point around which subdivision may occur (point subdivision). Area subdivision and point subdivision may be useful in various areas of a circuit plane such as perforations, test points, or areas where small size components are to be mounted.

Figure 3:
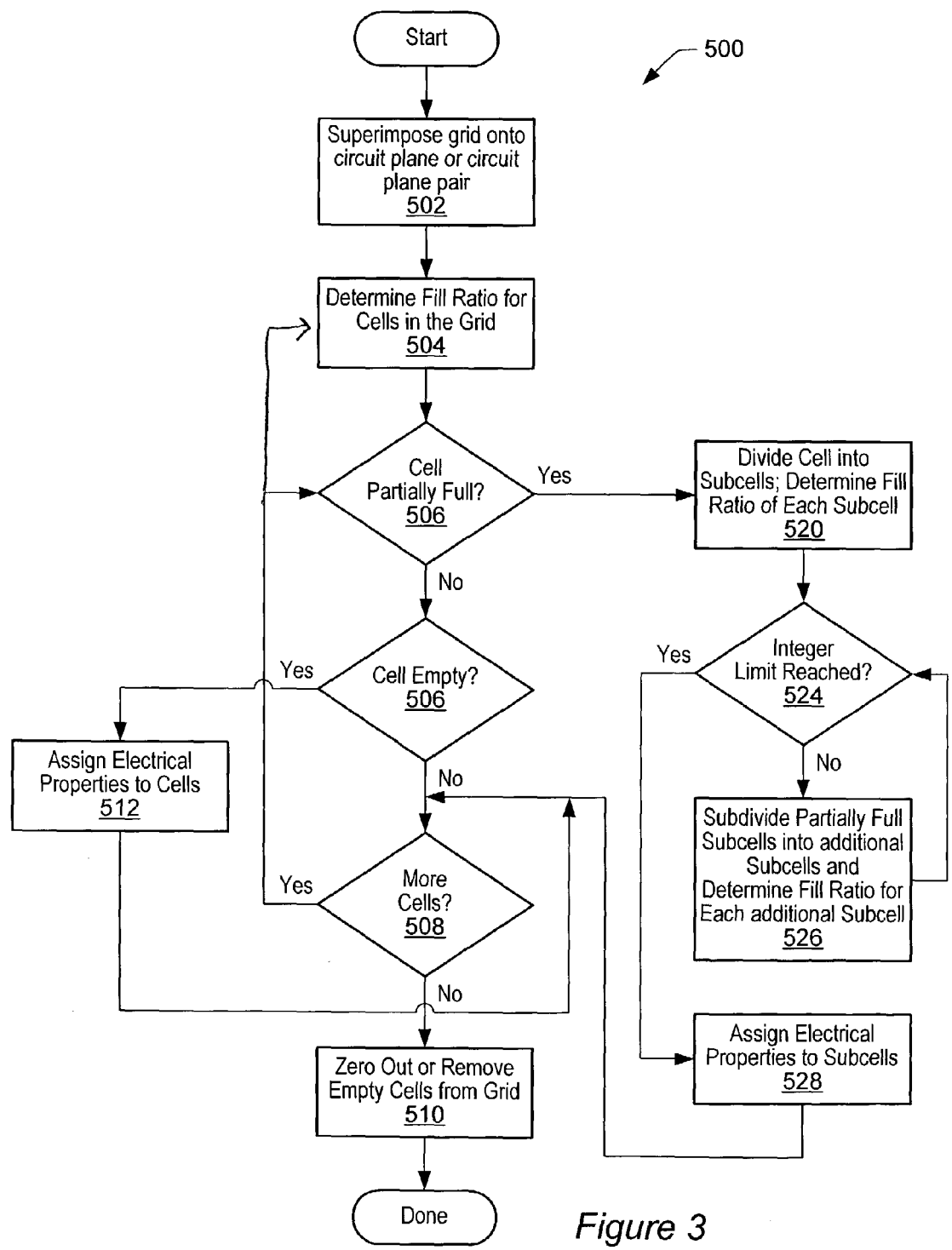
FIG. 3 is a flow diagram of one embodiment of a method for performing adaptive subgridding for power/ground plane simulations.

FIG. 3 is a flow diagram of one embodiment of a method for performing adaptive subgridding for power/ground plane simulations. In the embodiment shown, method 500 begins with the superimposing of a grid onto a circuit plane or a pair of circuit planes (502). The method may be performed by a computer system, and thus the grid and the circuit plane(s) may be represented as software entities. Following the superimposing of the grid on the circuit plane (or pair of circuit planes), fill ratios of each of the cells may be determined (504). In one embodiment, the method may determine whether each cell is full, partially empty, or empty.

If a cell is determined to be partially full (506) it may be divided into subcells, with the fill ratio of each of the subcells being determined following the division (520). In one embodiment, the number of subcells resulting from such a division may be a power of 2 (e.g., $2^2=4$ subcells resulting from the division). After the division of the cells, the method may determine if an integer value indicating a predefined number of iterations of divisions and subdivisions has been reached (524). The integer value may be a user input in one embodiment of the method.

If the integer limit has not been reached and any of the subcells resulting from the division is determined to be partially full, it may be subdivided into additional subcells (526), with the fill ratio of each of the new subcells being determined. This procedure may continue until the integer limit is reached, indicating that the maximum number of division/subdivision iterations has taken place. Once the integer value has been reached, electrical properties may be assigned to each of the subcells (528). The method may then determine whether more cells need to be checked to determine their fill ratio (508).

If a cell is determined to be full, the method may assign electrical properties to it subsequent to making such a determination (512). Following the determination that no more cells or subcells are to be checked (508), the method may zero out or remove all empty cells from the grid (510). The resulting grid from performing method 500 may approximate the shape of the circuit plane for which it was performed. If the method is performed for a pair of circuit planes (e.g., power and ground planes separated by a dielectric layer), the shape of the resulting grid of cells/subcells may approximate the area where the planes overlap each other. The final results from the performance of method 500 may be used for circuit simulations and/or other design tools in the design of electronic circuits.

Figure 4:
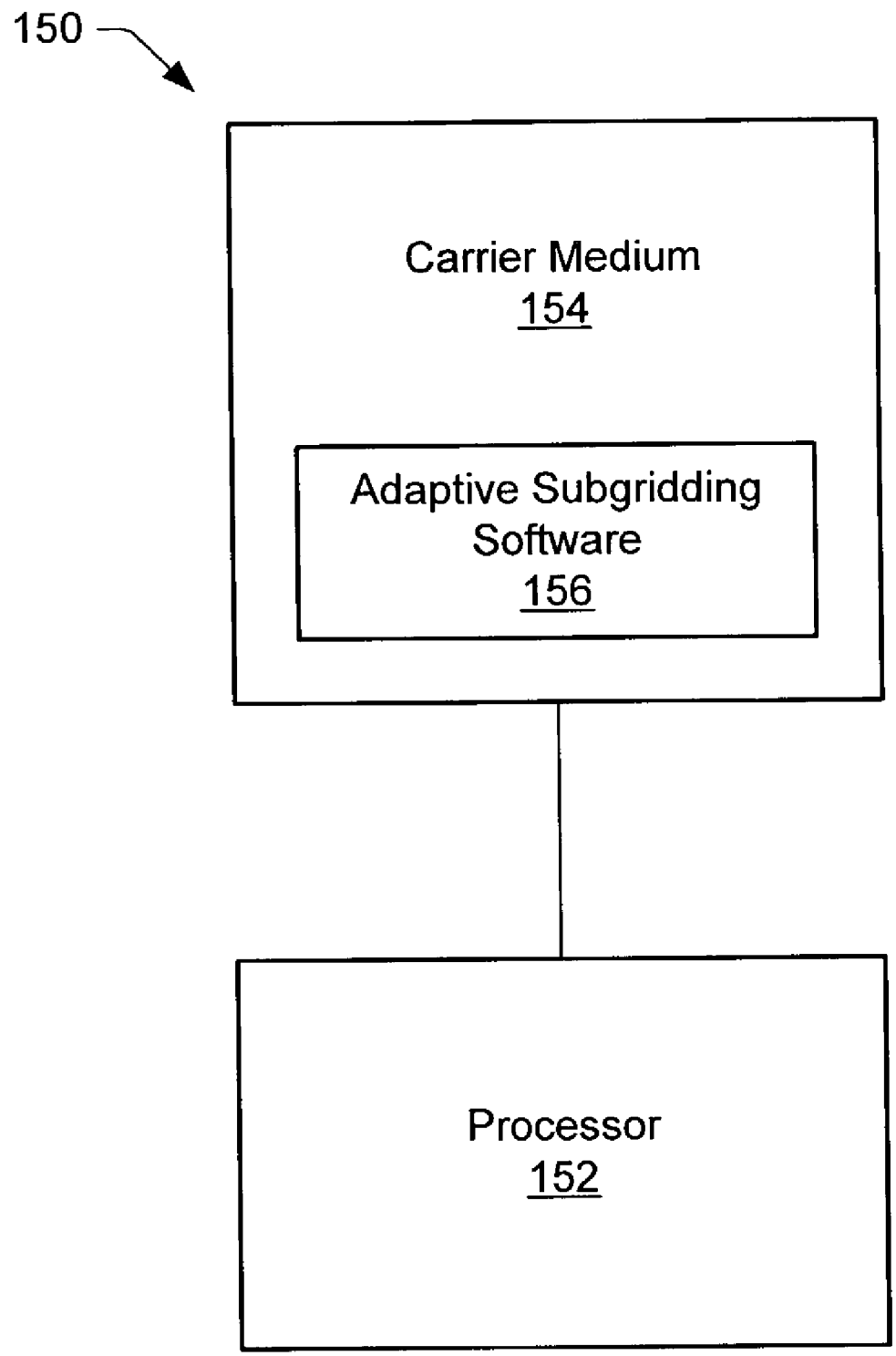
FIG. 4 is a block diagram of one embodiment of a computer system configured to perform a method of adaptive subgridding for power/ground plane simulations.

It should be noted that the flowchart shown in FIG. 4 represents only one possible embodiment of the method discussed herein. Other embodiments are possible and contemplated, and the exact sequence of events performed during execution of the method may be different from that shown in FIG. 3.

FIG. 4 is a block diagram of one embodiment of a computer system configured to perform a method of adaptive subgridding for power/ground plane simulations. In the embodiment shown, computer system 150 includes processor 152, which is coupled to carrier medium 154. Carrier medium 154 may be virtually any type of storage medium, including random access memory (RAM), hard disk storage, flash memory, and so on. Carrier medium 154 may include adaptive subgridding software 156. Adaptive subgridding software may include instructions that may be executed by processor 152 in order to perform an embodiment of the method discussed above. Additionally, adaptive subgridding software may allow for various user inputs, such as an integer value to indicate a number of iterations of divisions and subdivisions that are to be performed by the method, inputs indicating the shape of the circuit plane(s) for which the method is to be performed, and so forth.

Carrier medium 154 may also be configured to store various design tool software (e.g., SPICE or other circuit simulation software). The results produced by performing the adaptive subgridding methodology may be used as an input for the design tool software in order to design an electronic circuit or verify its operation.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An adaptive subgridding method for power/ground plane simulations, the method comprising:
   superimposing a grid of cells onto a representation of a circuit plane;
   determining a fill ratio of each of the cells of the grid, wherein the fill ratio represents an amount of cell area that overlaps with the circuit plane;
   for each cell having a fill ratio of less than a predetermined upper limit and greater than a predetermined lower limit:
      dividing the cell into subcells;
      determining the fill ratio of each of the subcells;
      for a subcell having a fill ratio of less than the predetermined upper limit and greater than the predetermined lower limit, subdividing the subcell into a plurality of smaller subcells; and
      repeating said determining the fill ratio and subdividing the subcell until a predetermined integer value is reached;
   creating a circuit model based on said superimposing, said determining a fill ratio for each of the cells, said dividing, said determining the fill ratio of each of the subcells, said subdividing, and said repeating, wherein the circuit model is used in a system to simulate operation of an electronic circuit.

2. The method as recited in claim 1, wherein the integer value indicates a number of iterations of said dividing and subdividing that are to occur in a given cell of the grid of cells.

3. The method as recited in claim 1, wherein the predetermined upper limit is 100%.

4. The method as recited in claim 1, wherein the predetermined lower limit is 0%.

5. The method as recited in claim 1, wherein said dividing the cell into subcells includes dividing the cell into a predetermined number of subcells.

6. The method as recited in claim 5, wherein the predetermined number of subcells is a power of 2.

7. The method as recited in claim 6, wherein the predetermined number of subcells is 4.

8. The method as recited in claim 1, wherein each cell of the grid is a square, and wherein each side of the square represents a transmission line segment, and wherein each transmission line segment is coupled to at least one other transmission line segment at a node.

9. The method as recited in claim 1, wherein each cell of the grid is a rectangle, and wherein each side of the rectangle represents a transmission line segment, and wherein each transmission line segment is coupled to at least one other transmission line segment at a node.

10. The method as recited in claim 1 further comprising calculating a capacitance value for a cell, wherein the capacitance value is determined by the formula:

$$C_C = \varepsilon_0 \varepsilon_r \frac{(\text{grid\_size})^2}{\text{plane\_separation}},$$

wherein grid_size is an area of the cell and plane_separation is a distance of separation between the circuit plane and another circuit plane.

11. The method as recited in claim 10 further comprising compensating for an open ended segment, wherein compensating for an open ended segment includes determining a fill ratio for a cell associated with the open ended segment and multiplying the grid_size by the fill ratio prior to said calculating the capacitance value for the cell.

12. The method as recited in claim 10 further comprising compensating for an area in the circuit plane that is uncovered by the grid of cells, wherein said compensating is performed by adding a static capacitance value to a node in the grid of cells, wherein the grid_size is the size of the area that is uncovered by the grid of cells.

13. A computer system comprising:
a processor; and
a carrier medium coupled to the processor, wherein the carrier medium is configured to store instructions that, when executed by the processor, create a model of an electronic circuit used in a system to simulate operation of the electronic circuit, wherein creating the model of the electronic circuit includes:
superimposing a grid of cells onto a representation of a circuit plane;
determining a fill ratio of each of the cells of the grid, wherein the fill ratio represents an amount of cell area that overlaps with the circuit plane; and
for each cell having a fill ratio of less than a predetermined upper limit and greater than a predetermined lower limit:
dividing the cell into subcells;
determining the fill ratio of each of the subcells;
for a subcell having a fill ratio of less than the predetermined upper limit and greater than the predetermined lower limit, subdividing the subcell into a plurality of smaller subcells; and
repeating said determining the fill ratio and subdividing the subcell until a predetermined integer value is reached.

14. The computer system as recited in claim 13, wherein the integer value indicates a number of times said dividing and subdividing is to occur in a given cell of the grid of cells.

15. The computer system as recited in claim 13, wherein the predetermined upper limit is 100%.

16. The computer system as recited in claim 13, wherein said dividing the cell into subcells includes dividing the cell into a predetermined number of subcells.

17. The computer system as recited in claim 16, wherein the predetermined number of subcells is a power of 2.

18. The computer system as recited in claim 17, wherein the predetermined number of subcells is 4.

19. The computer system as recited in claim 13, wherein each cell of the grid is a square, and wherein each side of the square represents a transmission line segment, and wherein each transmission line segment is coupled to at least one other transmission line segment at a node.

20. The computer system as recited in claim 13, wherein each cell of the grid is a rectangle, and wherein each side of the rectangle represents a transmission line segment, and wherein each transmission line segment is coupled to at least one other transmission line segment at a node.

21. The computer system as recited in claim 20, wherein the computer system is configured to calculate a capacitance value for a cell, wherein the capacitance value is determined by the formula:

$$C_C = \varepsilon_0 \varepsilon_r \frac{(\text{grid\_size})^2}{\text{plane\_separation}},$$

wherein grid_size is an area of the cell and plane_separation is a distance of separation between the circuit plane and another circuit plane.

22. The computer system as recited in claim 21, wherein the computer system is further configured to compensate for an open ended segment, wherein compensating for an open ended segment includes determining a fill ratio for a cell associated with the open ended segment and multiplying the grid_size by the fill ratio prior to said calculating the capacitance value for the cell.

23. The computer system as recited in claim 21, wherein the computer system is configured to compensate for an area in the circuit plane that is uncovered by the grid of cells, wherein said compensating is performed by adding a static capacitance value to a node in the grid of cells, and wherein the grid_size is the size of the area that is uncovered by the grid of cells.

24. An adaptive subgridding method for power/ground plane simulations, the method comprising:
superimposing a grid of cells onto a representation of a pair of circuit planes separated by a dielectric layer, wherein the pair of circuit planes includes an upper circuit plane and a lower circuit plane;
determining a fill ratio of each of the cells of the grid, wherein the fill ratio represents an amount of cell area that overlaps with the pair of circuit planes; and
for each cell having a fill ratio of less than a predetermined upper limit and greater than a predetermined lower limit:
dividing the cell into subcells;
determining the fill ratio of each of the subcells;
for a subcell having a fill ratio of less than the predetermined upper limit and greater than the predetermined lower limit, subdividing the subcell into a plurality of smaller subcells;
repeating said determining the fill ratio and subdividing the subcell until a predetermined integer value is reached; and creating a circuit model based on said superimposing, said determining a fill ratio for each of the cells, said dividing, said determining the fill ratio of each of the subcells, said subdividing, and said repeating, wherein the circuit model is used in a system to simulate operation of an electronic circuit.

25. The method as recited in claim 24, wherein the integer value indicates a number of iterations of said dividing and subdividing that are to occur in a given cell of the grid of cells.

26. The method as recited in claim 24 further comprising calculating a capacitance value for a cell, wherein the capacitance value is determined by the formula:

$$C_C = \varepsilon_0 \varepsilon_r \frac{(\text{grid\_size})^2}{\text{plane\_separation}},$$

wherein grid_size is an area of the cell and plane_separation is a distance of separation between the upper circuit plane and the lower circuit plane.

27. The method as recited in claim 26 further comprising compensating for an open ended segment, wherein compensating for an open ended segment includes determining a fill ratio for a cell associated with the open ended segment and multiplying the grid_size by the fill ratio prior to said calculating the capacitance value for the cell.

28. The method as recited in claim 26 further comprising compensating for an area in the circuit plane that is uncovered by the grid of cells, wherein said compensating is performed by adding a static capacitance value to a node in the grid of cells, wherein the grid_size is the size of the area that is uncovered by the grid of cells.

29. The method as recited in claim 24 further comprising calculating an impedance $Z_{o\_new}$ for a cell using the formula $Z_{o\_new} = Z_o/F_{pair}$, wherein $Z_o$ is an impedance value for a cell that is full and wherein $F_{pair}$ is the fill ratio of the cell.

30. The method as recited in claim 24 further comprising calculating a unit resistance $R_{upper\_new}$ for a cell of the upper circuit plane using the formula $R_{upper\_new} = R_{upper}/F_{upper}$, wherein $R_{upper}$ is the resistance of the upper circuit plane for a full cell and $F_{upper}$ is the fill ratio of the cell for the upper circuit plane.

31. The method as recited in claim 24 further comprising calculating a unit resistance $R_{lower\_new}$ for a cell of the lower circuit plane using the formula $R_{lower\_new} = R_{\_lower}/F_{\_lower}$, wherein $R_{\_lower}$ is the resistance of the lower circuit plane for a full cell and wherein $F_{\_lower}$ is the fill ratio of the cell for the lower circuit plane.

32. The method as recited in claim 24 further comprising calculating a parallel resistance loss $R_{p\_new}$ for a cell using the formula $R_{p\_new} = R_p/F_{pair}$, wherein $R_p$ is the parallel resistance loss for the cell and wherein $F_{pair}$ is the fill ratio of the cell.

* * * * *